United States Patent [19]

Keren

[11] Patent Number: 4,648,405
[45] Date of Patent: Mar. 10, 1987

[54] BODY PROBES
[75] Inventor: Hannan Keren, Kfar Saba, Israel
[73] Assignee: Elscint, Ltd., Haifa, Israel
[21] Appl. No.: 728,871
[22] Filed: Apr. 30, 1985
[51] Int. Cl.$^4$ ............................................. A61B 5/04
[52] U.S. Cl. ................................... 128/653; 324/309; 324/313
[58] Field of Search ............... 324/307, 309, 311, 313, 324/314–315, 322; 128/653

[56] References Cited
U.S. PATENT DOCUMENTS

| 3,603,871 | 9/1971 | Caunter et al. | 324/322 |
| 3,771,055 | 11/1973 | Anderson | 324/322 |
| 4,452,250 | 6/1984 | Chance et al. | 128/653 |

FOREIGN PATENT DOCUMENTS 0132338  1/1983  European Pat. Off. ............ 324/307

OTHER PUBLICATIONS

"An Efficient Decoupler Coil Design which Reduces Heating in Conductive Samples in Superconducting Spectrometers", Journal of Magnetic Resonance, 36, 447–451 (1979).
"A Large-Inductance, High-Frequency, High-Q, Series-Tuned Coil for NMR", Journal of Magnetic Resonance 49, 346–349 (1982).

Primary Examiner—Kyle L. Howell
Assistant Examiner—Francis J. Jaworski
Attorney, Agent, or Firm—Sandler & Greenblum

[57] ABSTRACT

An improved body probe for use in high field Mr data acquisition systems having a two feed balanced inductor circuit using series capacitors to control the effect of stray capacitance and coupling resistors connected across the coil approximately mid-way between the two feed points. This arrangement is superior to prior art body probes operating in whole body high field MR imagers.

9 Claims, 1 Drawing Figure

BODY PROBES

FIELD OF THE INVENTION

This invention is concerned with magnetic resonance (MR) data acquisition systems and more particularly to body probes used in such systems.

BACKGROUND OF THE INVENTION

Magnetic resonance data acquisition systems comprise generally a superconducting magnet for providing a static magnetic field. Gradient coils are provided to focus the magnetic field. The gradient coils and the static magnetic field are used to align nuclei in a desired plane of the sample being imaged or spectrographically studied under MR conditions. A pulsed radio frequency (Rf) MR signal is used to nutate the nuclei. When the Rf pulse ends the nutated nuclei tend to return to the aligned condition. As they are returning they generate free induction decay (FID) signals. It is the FID signals that are most popularly used for imaging purposes.

The coils used for transmitting the Rf signals are also generally used for receiving the FID signals. The Rf frequency used is the LARMOR frequency. The LARMOR frequency as is well known is a function of the particular element under study and the magnetic field strength.

The static magnetic field is generated by the superconducting magnet and the specimen or patient is placed within the bore of the superconducting magnet. The Rf coils or probes, are generally built around the bore, however, it has been found, as can be expected, that better nutation and more efficient reception is obtained when probes, are used for imaging particular sections of the body rather than the main probe. The Rf probes such as a head probe, leg probe, and body probe are Rf coils arranged to be juxtaposed to the patient's body close to the plane or volume being imaged.

Improved images are provided by the probes that are used proximate to the portions of the body being imaged because among other reasons, of a filling factor.

Notwithstanding the more efficient action of the proximate probes, signal to noise ratio of the required data remains critical because of the very small amplitudes of the FID signals. The probes cause an increase in noise, among other things, because of imbalances due to stray capacitance in the proximate probes themselves and because of the variations in the impedance of the coils of the probes introduced by the patient or sample. Thus, different patients have different body impedances and therefore effect the proximate probes differently. In addition to the effect of the individual samples, the distributed capacitance of the probes is variable in that it changes with temperature and relative humidity, among other things. The rooms wherein magnetic resonance data acquisition occur are carefully controlled as to temperature and humidity. Nonetheless there are day to day variations in the distributed capacitance of the proximate probes.

In addition, a basic problem with all large coils is that they normally have low self resonance frequencies. Another problem is the heating or conductive samples in superconducting spectrometers. These problems are treated in the following two articles respectively:

(1) A Large Inductance High Frequency High Q, Series Fused Coil for NMR" by B. Cook and I. Lowe, Journal of Magnetic Resonance 49, pp 346–349, 1982; and (2) "An Efficient Decoupler Coil Design which Reduces Heating in Conductive samples in Superconducting Spectrometers" by D. W. Alderman and D. M. Grant, Journal of Magnetic Resonance, 36, pp 447–451, 1979.

BRIEF DESCRIPTION OF THE INVENTION

Accordingly, there is a need for improved proximate probes having a controlled amount of capacitance and impedance.

In a broad aspect of the present invention an improved proximate probe is provided for use in magnetic resonance (MR) data acquisition systems, said improved proximate probe comprises:

first and second coil means located at opposite sides of a sample, said first and second coil means being positioned to nutate nuclei aligned by a main magnet means when Rf pulses are transmitted through said first and second coil means, said first and second coil means being balanced and comprising first, second, third and fourth conductor lengths arranged to define a closed area, said first and second conductor lengths being joined by first capacitor means, said third and fourth conductor lengths being joined by second capacitor means, said first and fourth conductor lengths being connected to a first source of Rf power, said second and third conductor lengths being to a second source of Rf power, said first and second sources of Rf power being coupled to drive current through the first coil means in the same direction.

A feature of the invention includes resistance means for connecting said first and third conductor lengths in the vicinity of said first and second capacitor means.

According to an aspect of the invention, the same Rf source can be used with hybrid means as said first and second source of Rf power.

A broad aspect and feature of the invention comprises means for reducing distributed capacitance or controlling the distributed capacitance of the coils of a body probe.

Yet another feature comprising means for reducing imbalances in balanced two feed body probes.

BRIEF DESCRIPTION OF THE DRAWINGS

The above named and other features of the present invention will become more apparent when taken in conjunction with the following description of an exemplary embodiment of the invention, along with the accompanying schematic showing of the improved body probe of the invention.

GENERAL DESCRIPTION

Figure 1:
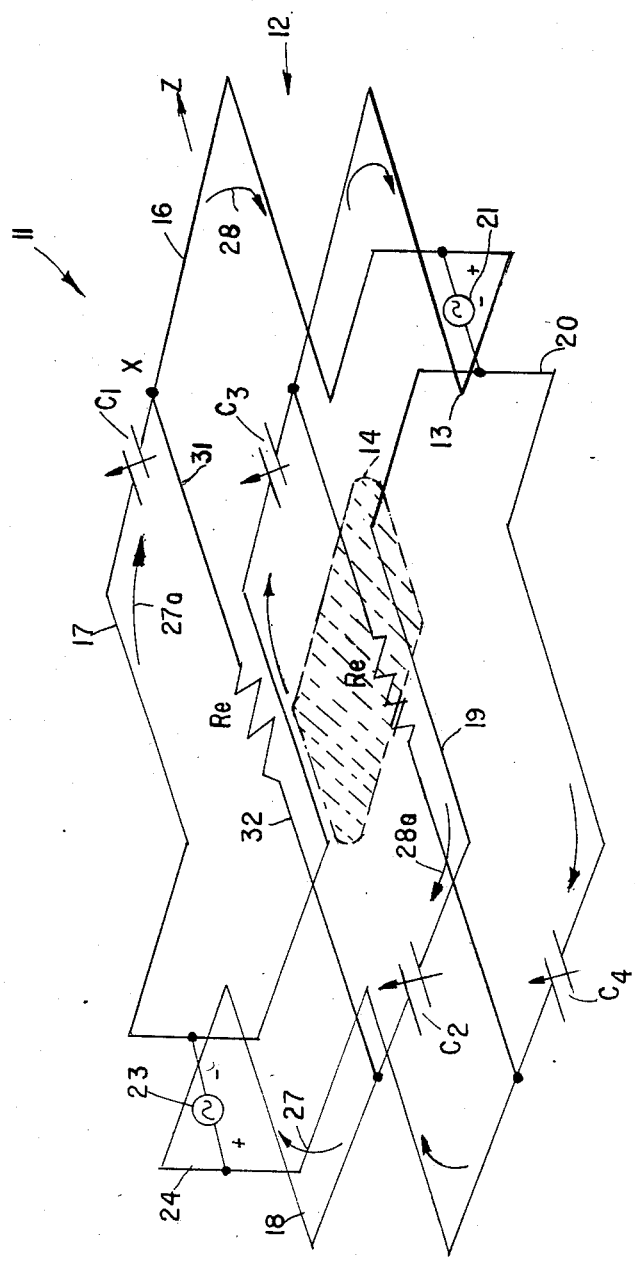

The drawing is a schematic showing of a balanced two feed proximate or body probe. More particularly the two feed body probe includes a first coils means, 12, located in the upper part of the tunnel or bore of a magnet used for generating a large static field in an MR system, for example, while the second coil 13 is located in the bottom portion of the bore below the patient or sample, indicated in cross-section at 14.

In a preferred embodiment each of the coils include a plurality of sections or conductor lengths, such as coil 12 shown as including the first conductor length 16, a second conductor length 17, a third conductor length 18 and a fourth conductor length 19. The bottom coil is sectioned in the same manner.

Means are provided for reducing or controlling the distributed capacitance. More particularly capacitor means such as capacitor C1 is used to interconnect conductor lengths 16 and 17; while capacitor C2 is used to interconnect conductor lengths 18 and 19.

The conductor 16 is connected to one terminal of Rf generator shown as 21. The terminal is shown as a negative terminal. It must be understood that the generator is generating radio frequencies so it varies between negative and positive, but while it is negative the other terminal of the Rf generator is positive and is connected by lead 22 to conductor length 19. The other side of the two feed balanced coil is connected to RF generator 23. In this case, a positive terminal of Rf generator 23 is connected by lead 24 to conductor length 17. The negative terminal of Rf generator 23 is connected by lead 26 to conductor length 18. Thus, the generator 23 tends to drive a current in the direction as shown by arrow 27, and 27a, while the generator 21 tends to also drive currents in the same direction as shown by the arrows 28 and 28a, respectively.

It should be noted that the inductance and capacitance arrangement of coil unit 13 is the same as that of coil unit 12; therefore the explanation of coil unit 12 applies to coil unit 13 also. The series circuit capacitors C1 and C2 reduce the distributed capacitance of the circuit. In a preferred embodiment series capacitors C1 and C2 of 10 Pf were used along with body coils having inductances of 65 microhenries. The balanced two feed probe was used for resonant frequencies of up to 120 megahertz. For hydrogen for example, 84 megahertz is required in a field of two Tesla. By adjusting the capacitance, the 84 megahertz is easily achieved.

In addition it is desirable to couple a resistor shown as Rc between points X and Y of circuit 12. This resistor balances out any inherent unbalances in the loop provided by the four conductor sections, 16, 17, 18 and 19. Thus, section 16 at point X is the same voltage as the point Y of section 18, and differences that may actually exist cause a current flow through the conductor 31, resistor Re and conductor 32.

It is noted that the first article referred to hereinabove teaches a small coil for use in spectrography. Thus, the article is concerned with coils constructed to operate with high frequencies of approximately 300 megahertz. The authors generally notes that the same idea can be used to construct very large coils operating at low frequencies. However, the article is silent as to how to use the idea of the article with such coils which probably have not been constructed nor tested. In addition this invention is distinguishable over the coils or probes of the articles, among other ways, in that the probes described herein are balanced two feed type coils, and include a coupling resistor for cancelling out inbalances in the individual circuits 12 and 13.

Attempts to construct a body coil according to the teachings of Cook and Lowe were not successful in that the resulting coils had extremely low Q's among other things.

In operation, the body coil is used with a patient 14 within the bore or the main magnet used to create a static magnetic field. The static field causes nuclei to be aligned with the static field. The aligned nuclei are nutated by radio frequency pulses in the order of 90 megahertz, for hydrogen protons. After the Rf pulses are removed free induction decay (FID) signals are received in the improved Rf probes. In a preferred embodiment the same probe is used for transmitting and receiving. The FID signals are used to provide image data for constructing an image of a section of the body in which the Rf nutation is focused by gradient coils, which are powered in conjunction with the static field and the Rf pulses in a manner well known to those skilled in the art. The improved body probe provides a well focused Rf signal that has a distributed capacitance that is a function of the inserted series capacitors, thus the distributed self capacitance problem, i.e. the patient's effect on capacitance is obviated. The balance of the probe is improved by the coupling resistor Rc. Also, once the body probe is tuned for the element desired to be nutated, i.e. hydrogen in a preferred embodiment, there is no necessity for returning the coil for each patient because patients do not adversely load the balanced coil.

While the invention has been described using a preferred embodiment it should be understood that this description is by way of example only and not as a limitation on the scope of the invention, which invention is delineated by the following claims.

What is claimed is:

1. An improved probe for magnetic resonance (MR) data acquisition systems, said probe comprising:
    (a) first and second coil means adapted to be located at opposite sides of a sample, said coil means positioned to transmit radio frequency (Rf) pulses to nutate nuclei in said sample that were aligned by a main magnetic field and/or to receive free induction decay (FID) signals generated as the nutated nuclei realign;
    (b) means for connecting said first and second coil means to a source of pulses of Rf potential to drive current through said first and second coil means;
    (c) said means for connecting said first and second coil means to said source of pulses of Rf potential comprising two pair of first and second terminals for coil means, said first and second terminals connected to opposite sides of each of said coil means, each of said pair of terminals being of opposite instantaneous polarity to cause current to flow in the same direction through each of said coil means; and
    (d) resistance means attached between first and second points, said first and point being equidistance from said first terminals of each of said two pair of terminals and said second point being equidistant from said second terminals of each of said two pair of terminals to theoretically be at the same potential, causing current to flow through said resistance means responsive to impedance imbalances thereby reducing effects of impedance imbalances in said first and second coil means.

2. The probe of claim 1 including means for reducing the effect of distributed capacitance of the coils of said first and second coil means.

3. The probe of claim 2 wherein said means for reducing the distributed capacitance comprises series capacitor means in said coil means.

4. The probe of claim 2 wherein said resistance means comprises resistor means.

5. The probe of claim 4 wherein each of said coils means are balanced.

6. The probe of claim 4 wherein two sources of pulses of Rf potential are provided with one of each of said two sources being connected to one of each of two pairs of first and second terminals at opposite sides of each of said coil means, said first and second coil means being coupled at first and second terminals of both of said pair of terminals.

7. The probe of claim 1 wherein:
   (a) said first and second coil means are balanced and each comprises first, second, third and fourth conductor lengths arranged to define a closed area;
   (b) said first and second conductor lengths joined by first capacitor means in each of said coil means;
   (c) said third and fourth conductor lengths joined by second capacitor means in each of said coil means;
   (d) said first and fourth conductor lengths being connected to a first pair of said two pairs of terminals;
   (e) said second and third conductor lengths being connected to a second pair of said two pairs of terminals;
   (f) said first and second pair of terminals being coupled to said source of pulses of Rf potential to cause currents to flow through to each of the coil means in the same directions;
   (g) said first and second capacitor means in each of said coil means having equal capacitance; and
   (h) said first, second, third, and fourth conductor lengths in each of said coil means having equal inductances to achieve theoretical equal potentials at opposite points in each of said coil means.

8. The probe of claim 7 wherein said resistance means are connected from said first conductor length in the vicinity of said first capacitor means to the third conductor length in the vicinity of said second capacitor means at points of theoretically equal potential.

9. The probe of claim 8 wherein the resistance means comprises resistor means.

* * * * *